US009530760B2

United States Patent
Kawano (10) Patent No.: US 9,530,760 B2
(45) Date of Patent: Dec. 27, 2016

(54) LIGHT EMITTING DEVICE HAVING PLURALITY OF LIGHT EMITTING ELEMENTS AND LIGHT REFLECTIVE MEMBER

(71) Applicant: NICHIA CORPORATION, Anan-shi (JP)

(72) Inventor: Yusuke Kawano, Anan (JP)

(73) Assignee: NICHIA CORPORATION, Anan-Shi (JP)

( * ) Notice: Subject to any disclaimer, the term of this patent is extended or adjusted under 35 U.S.C. 154(b) by 0 days.

(21) Appl. No.: 14/582,957

(22) Filed: Dec. 24, 2014

(65) Prior Publication Data

US 2015/0187838 A1 Jul. 2, 2015

(30) Foreign Application Priority Data

Dec. 28, 2013 (JP) .................. 2013-273683

(51) Int. Cl.
*H01L 29/18* (2006.01)
*H01L 25/075* (2006.01)
*H01L 33/60* (2010.01)

(52) U.S. Cl.
CPC ........... *H01L 25/0753* (2013.01); *H01L 33/60* (2013.01); *H01L 2924/0002* (2013.01); *H01L 2933/0033* (2013.01); *H01L 2933/0058* (2013.01)

(58) Field of Classification Search
CPC ........ H01L 27/15; H01L 33/60; H01L 33/483; H01L 33/005; H01L 2933/0033; H01L 2933/0058

USPC ............................................... 257/88; 438/27
See application file for complete search history.

(56) References Cited

U.S. PATENT DOCUMENTS

| | | | | |
|---|---|---|---|---|
| 7,963,689 | B2 * | 6/2011 | Lee | F21V 7/0016 362/245 |
| 2010/0258825 | A1 | 10/2010 | Ohta et al. | |
| 2011/0116271 | A1 * | 5/2011 | Ide | H01L 33/486 362/294 |
| 2012/0032196 | A1 | 2/2012 | Sato et al. | |
| 2012/0224378 | A1 * | 9/2012 | Koike | C09K 11/7774 362/259 |
| 2013/0334974 | A1 | 12/2013 | Tamura et al. | |
| 2014/0021506 | A1 | 1/2014 | Yamada | |
| 2014/0198355 | A1 * | 7/2014 | Miwa | H04N 1/0318 358/482 |
| 2014/0362570 | A1 * | 12/2014 | Miyoshi | F21K 9/00 362/240 |

FOREIGN PATENT DOCUMENTS

| | | |
|---|---|---|
| EP | 2 535 954 A1 | 12/2012 |
| JP | 2010-245481 A | 10/2010 |
| JP | 2011-521469 A | 7/2011 |
| JP | 2012-038957 A | 2/2012 |
| JP | 2012-099572 A | 5/2012 |

(Continued)

*Primary Examiner* — Jami M Valentine
(74) *Attorney, Agent, or Firm* — Foley & Lardner LLP (57) ABSTRACT

A light emitting device includes: a base member; and a plurality of light emitting elements mounted on the base member. The plurality of light emitting elements includes: at least one first light emitting element having a side surface uncovered by a light reflective member; and at least one second light emitting element having a side surface covered by the light reflective member.

22 Claims, 4 Drawing Sheets

(56) References Cited

FOREIGN PATENT DOCUMENTS

| | | |
|---|---|---|
| JP | 2013-219263 A | 10/2013 |
| JP | 2014-007154 A | 1/2014 |
| JP | 2014-022581 A | 2/2014 |
| WO | WO-2009/142675 A2 | 11/2009 |
| WO | WO-2011/099384 A1 | 8/2011 |

* cited by examiner

ABSTRACT_ONLY_SKIP

LIGHT EMITTING DEVICE HAVING PLURALITY OF LIGHT EMITTING ELEMENTS AND LIGHT REFLECTIVE MEMBER

CROSS-REFERENCE TO RELATED APPLICATION

This application claims priority to Japanese Patent Application No. 2013-273683, filed on Dec. 28, 2013. The entire disclosure of Japanese Patent Application No. 2013-273683 is are hereby incorporated herein by reference.

BACKGROUND

Technical Field

The present disclosure relates to a light emitting device and a method of manufacturing the light emitting device.

Description of Related Art

A light emitting device having a plurality of light emitting elements has been known (see JP 2011-521469 W and JP 2012-38957 A).

However, in such a conventional light emitting device, a part of light emitted from one light emitting element may be incident to other light emitting elements and absorbed.

Accordingly, an object of the present invention is to provide a light emitting device in which absorption of light emitted from a light-emitting element by other light-emitting elements is reduced.

SUMMARY OF THE INVENTION

A light-emitting device according to representative embodiments of the present invention includes a base member and a plurality of light emitting elements mounted on the base member. The plurality of light emitting elements include at least one first light emitting element having a side surface uncovered with a light reflective member and at least one second light emitting element having side surfaces covered with the light reflective member.

According to the embodiments of the present invention, absorption of light emitted from a light emitting element by other light emitting elements can be reduced.

BRIEF DESCRIPTION OF THE DRAWINGS

FIGS. 1A to 1C schematically illustrate a light emitting device according to a first embodiment, where

FIGS. 3A to 3C schematically illustrate a light emitting device according to a second embodiment, where

DETAILED DESCRIPTION OF REPRESENTATIVE EMBODIMENTS

Light Emitting Device According to a First Embodiment of the Present Invention

Figure 1A:
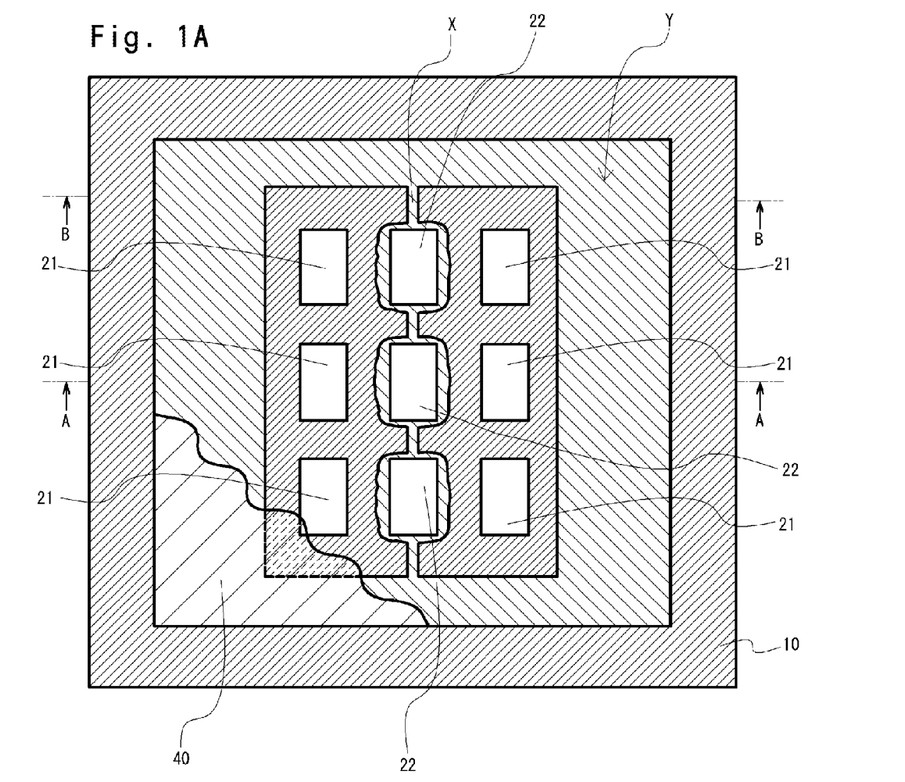
FIG. 1A shows a plan view.
Figure 1B:
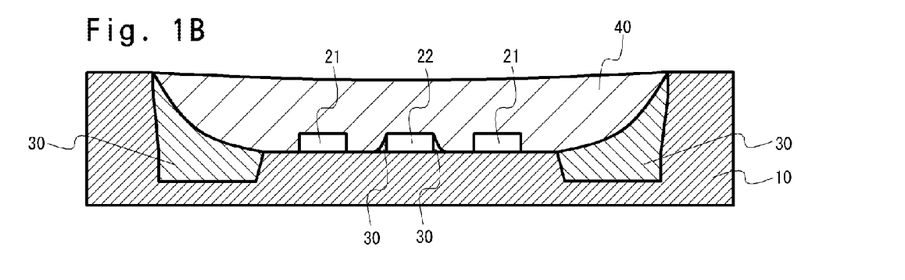
FIG. 1B shows a sectional view taken along line A-A in FIG. 1A.
Figure 1C:
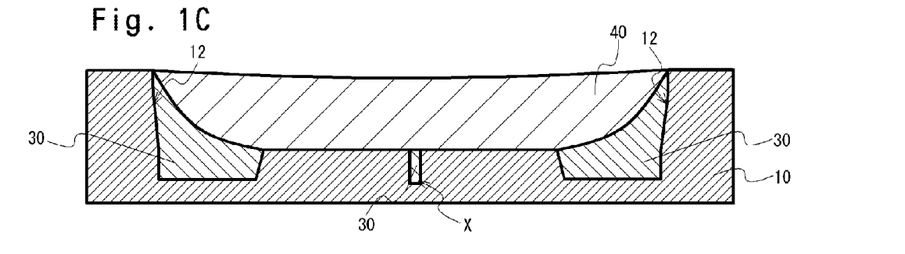
FIG. 1C shows a sectional view taken along line B-B in FIG. 1A.

FIGS. 1A to 1A schematically illustrate a light emitting device according to a first embodiment, where FIG. 1A shows a plan view, FIG. 1B shows a sectional view taken along line A-A in FIG. 1A, and FIG. 1C shows a sectional view taken along line B-B in FIG. 1A. In FIG. 1A, a part of a sealing member 40 is not illustrated in order to facilitate understanding.

As illustrated in FIGS. 1A to 1C, the light emitting device according to the first embodiment includes a base member 10 and a plurality of light emitting elements 21 and 22 mounted on the base member 10. The plurality of light emitting elements 21 and 22 include at least one first light emitting element 21 having a side surface not covered with a light reflective member 30, and at least one second light emitting element 22 having side surfaces covered with the light reflective member 30.

Hereinafter, descriptions will be given sequentially.

(Base Member 10)

The base member 10 includes an insulating member and a conductive member.

Examples of the insulating member that can be used include thermoplastic resins such as a PPA (polyphthalamide), a PPS (polyphenylenesulfide), a liquid crystal polymer, and nylon, and thermosetting resins such as an epoxy resin, a silicone resin, a modified epoxy resin, a modified silicone resin, a urethane resin, and an acrylate resin. Also, a glass epoxy resin, ceramics, glass, or the like can be used. As the ceramics, it is preferable to use alumina, aluminum nitride, mullite, silicon carbide, silicon nitride, or the like. It is particularly preferable to use alumina or mullite, which is highly reflective and inexpensive.

Examples of the conductive member include a conductor wiring provided over the insulating member in a predetermined pattern, and a lead frame fixed by the insulating member described above.

The conductor wiring can be formed, for example, by firing the insulating member described above on which a conductive paste containing fine particles of a high-melt point metal such as tungsten or molybdenum is applied in a predetermined pattern. Alternatively, the conductor wiring can be formed on a ceramics plate that has been previously fired, by using a method such as vacuum vapor deposition, sputtering, or plating. Further, the lead frame is attached to the positive electrode and the negative electrode of the light emitting element and functions as the electrodes of the light emitting device which are electrically connected to the respective external electrodes. Specifically, the lead frame can be made of aluminum, iron, nickel, copper, a copper alloy, stainless steel, an Invar alloy, or the like. The lead frame may also be made of a clad material in which different kinds of metals are cladded. A surface of the lead frame is preferably plated with a noble metal such as Au, Ag, Pt, Rh, or Ir, or an alloy containing these metals.

The base member 10 can include at least one groove X or can include more than one grooves X, although the detailed description herein will describe one groove X. By reference to FIG. 1, the groove X that leads the light reflective member 30 to the second light emitting element 22. When the base member 10 includes the groove X, for example, the light reflective member 30 which is placed by dropping in a surrounding region Y that surrounds the plurality of light emitting elements 21 and 22 can be led from the surrounding region Y to the second light emitting elements 22 using the groove X. Therefore, covering the side surfaces of the second light emitting elements 22 with the light reflective member 30 can be facilitated. Here, the light reflective member 30 placed in the groove X may be either connected or not connected to the light reflective member 30 placed in the surrounding region Y.

The width of the groove X is not specifically limited as long as the light reflective member 30 can be placed on the side surfaces of the light emitting elements 22, but preferably may be 100 μm or less, and more preferably 50 μm or less. By setting the width of the groove X to 100 μm or less, it is possible to ensure joint strength of the light emitting elements 22 and the base member 10 as well as heat radiating performances of the light emitting elements 22. Alternatively, the width of the groove X may be 20% or less, and more preferably 10% or less, to the length of the corresponding light emitting element 22 in the width direction of the groove X.

The depth of the groove X is not particularly limited as long as the light reflective member 30 can be disposed on the side surfaces of the light emitting elements 22, but preferably in a range from 20 μm to 200 μm, and more preferably in a range from 50 μm to 100 μm. By setting the depth of the groove X to 20 μm or more, it is possible to efficiently dispose the light reflective member 30 on the side surfaces of the light emitting elements 22.

In the specification, the expression "surrounding region Y that surrounds the plurality of light emitting elements 21 and 22" applied in a light emitting device in which the base member 10 includes inner walls 12 defining a recess portion, for example, refers to a region in contact with the inner walls 12. In this case, for example, the inner walls 12 defining the recess portion are preferably covered with the light reflective member 30. In this manner, light emitted from the plurality of light emitting elements 21 and 22 toward the inner walls 12 defining the recess portion can be reflected by the light reflective member 30, so that the light-extraction efficiency of the light emitting device can be improved.

It should be noted that the base member 10 may not necessarily include the groove X that leads the light reflective member 30 to the second light emitting element 22. In this case, the light emitting element 22 having all or one or several side surfaces already covered with the light reflective member 30 may be mounted on the base member 10, for example.

(Plurality of Light Emitting Elements 21 and 22)

The plurality of light emitting elements 21 and 22 are mounted on the base member 10. Intervals at which the plurality of light emitting elements 21 and 22 are mounted are not particularly limited, but the plurality of light emitting elements 21 and 22 may be mounted at intervals in a range of 0.2 mm to 0.3 mm, for example. By setting the intervals to 0.2 mm or more, it is possible to reduce unintended creeping up of the light reflective member 30 on the light emitting elements. Further, by setting the intervals to 0.3 mm or smaller, the light from the plurality of light emitting elements 21 and 22 can be effectively reflected by the light reflective member 30. As used herein, the expression "intervals at which the light emitting elements are mounted" refer to a shortest distance between the side surfaces of two adjacent light emitting elements.

Portions on the base member 10 at which the plurality of light emitting elements 21 and 22 are mounted are not particularly limited, but in the case of a light emitting device having the plurality of light emitting elements 21 and 22 mounted in the same plane on the base member 10 (including a plane having more or less unevenness), a part of light emitted from one of the light emitting elements 21 and 22 is easily incident on other light emitting elements 21 and 22. Therefore, the first embodiment is particularly effective for such a light emitting device.

The plurality of light emitting elements 21 and 22 include at least one first light emitting element 21 and at least one second light emitting element 22. Here, the first light emitting elements 21 are each a light emitting element having side surfaces that are not covered with the light reflective member 30, and light emitted from the first light emitting element 21 is efficiently extracted outside the light emitting device. On the other hand, the second light emitting elements 22 are each an light emitting element having side surfaces that are covered with the light reflective member 30, and light emitted from other light emitting elements incident on the side surfaces of the second light emitting element 22 can be efficiently reduced by the light reflective member 30. All side surfaces of the second light emitting element 22 may be covered with the light reflective member 30, or only one or several surfaces of all side surfaces may be covered with the light reflective member 30. In the case where all side surfaces of the second light emitting element 22 are covered with the light reflective member 30, light is mainly emitted from an upper surface of the second light emitting element 22. In the case where only one or several surfaces of all side surfaces of the second light emitting element 22 are covered with the light reflective member 30, light is mainly emitted from the upper surface and one or several side surfaces that are not covered with the light reflective member 30 of the second light emitting element 22.

The second light emitting elements 22 may be mounted in various orientations. However, in the case where a side surface of the second light emitting element 22 that is covered with the light reflective member 30 faces a side surface of adjacent first light emitting element 21, light emitted from the first light emitting element 21 relatively easily enter the side surface of the second light emitting element 22 (light mainly emitted from the side surface of the first light emitting element 21 easily enter, but a part of the light emitted from the upper surface of the first light emitting element 21 may be scattered and enters the side surfaces of the second light emitting element 22). The first embodiment is more particularly effective for such a light emitting device.

In the case in which the plurality of light emitting elements 21 and 22 are each in a rectangular shape having a long side and a short side, and in which the side surface of the second light emitting element 22 covered with the light reflective member 30 is substantially in parallel to the long side of the second light emitting element 22, a planar dimension of the light reflective member 30 can be increased.

Each of the second light emitting elements 22 do not have to be disposed between the plurality of first light emitting elements 21. However, in a light emitting device having the second light emitting elements 22 disposed between the plurality of first light emitting elements 21, light emitted from the first light emitting element 21 relatively more easily directly enters the side surface of the second light emitting element 22. Therefore, the first embodiment is particularly effective for such a light emitting device.

In the case in which the base member 10 includes the groove X, the second light emitting element 22 can be disposed in a region in which the groove X is not provided, for example. In this case, one side and the other side of the second light emitting element 22 are respectively adjacent to an end of the grooves X. With this arrangement, the light reflective member 30 can be provided so that, for example, from the surrounding region Y that surrounds the plurality of light emitting elements 21 and 22 to one side of the second light emitting element 22, the light reflective member 30 is placed through the groove X, and from the one side to the other side of the second light emitting element 22 the light reflective member 30 is placed along the side surfaces of the second light emitting element, and from the other surface pf the second light emitting element 22 the light transmissive member 30 is placed through the groove X. Here, the term "one side and the other side of the second light emitting element 22" are the surfaces which are different from the side surfaces of the second light emitting element 22.

For the first light emitting element 21 and the second light emitting element 22, a light emitting diode (LED), a laser diode (LD), or the like, can be employed. Further, in the case where the first light emitting elements 21 and the second light emitting elements 22 are electrically connected to the conductive member provided in the base member 10, a known method can be used. For example, wires made of a metal having superior heat conductivity and the like can be used for the connection.

(Light Reflective Member 30)

The light reflective member 30 covers the side surfaces of each of the second light emitting elements 22. The light reflective member 30 may cover either an entire region of a side surface of the second light emitting element 22, or only a part of the side surface of the second light emitting element 22. Here, in the case where the light reflective member 30 covers the side surface of the second light emitting element 22 using the groove X, the groove X is covered with the light reflective member 30.

For the light reflective member 30, a resin which contains a light reflecting material or the like can be used. Examples of the light reflecting material that can be used include $TiO_2$, $SiO_2$, and $Al_2O_3$. Further, examples of the resin that can be used include a silicone resin, an epoxy resin, and a urea resin. In addition, a viscosity of the light reflective member 30 can be altered as appropriate.

A shape of the light reflective member 30 is not particularly limited. But, for example, as illustrated in FIG. 1B, the light reflective member 30 can be in a shape creeping up the light emitting element 22 from its lower surface to the upper surface. In other words, the light reflective member 30 can be in a shape with a thickness on the side surface of the light emitting element 22 decreasing upward. With this arrangement, light emitted from a light emitting element toward a side surface of another light emitting element can be efficiently reflected and directed toward an emission side of the light emitting device, and therefore it is possible to improve the light-extraction efficiency.

(Sealing Member 40)

The plurality of light emitting elements 21 and 22 are sealed with the sealing member 40. For the sealing member 40, a silicone resin, an epoxy resin, a urea resin, or the like can be used. Further, the sealing member 40 may contain a phosphor to absorb at least a part of light from the light emitting elements 21 and 22 and emits light having a different wavelength.

According to the first embodiment described above, the second light emitting elements 22 whose side surfaces are covered with the light reflective member 30 are included among the first light emitting elements 21 whose side surfaces are not covered with the light reflective member 30.

Therefore, absorption of light by the light emitting elements 21 and 22 can be reduced without reducing significant reduction in the light-extraction efficiency. Thus, the light-extraction efficiency of the light emitting device as a whole can be improved.

[Method of Manufacturing Light Emitting Device According to First Embodiment]

FIGS. 2A to 2D illustrate a method of manufacturing the light emitting device according to the first embodiment, each showing a schematic plan view and a sectional view taken along line A-A in the corresponding schematic plan view.

As illustrated in FIGS. 2A to 2D, the method of manufacturing the light emitting device according to the first embodiment of the present invention includes: preparing the base member 10 having the groove X (first step); mounting the plurality of light emitting elements 21 and 22 on the base member 10 (second step); disposing the light reflective member 30 on the base member 10, and leading the light reflective member 30 to cover a side surface of at least one of the plurality of light emitting elements (third step); and sealing the plurality of light emitting elements 21 and 22 with the sealing member 40 (fourth step).

Hereinafter, descriptions will be given sequentially.

(First Step) Preparing Base Member Having Groove

Figure 2A:
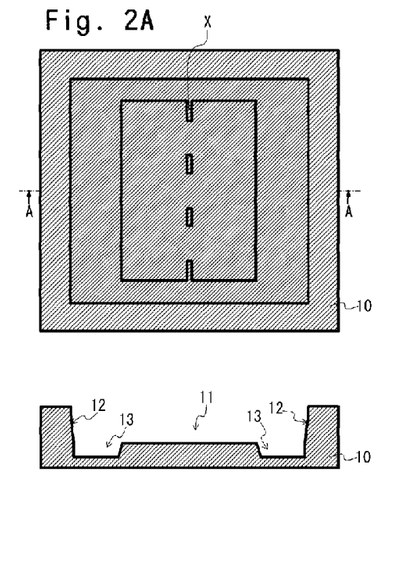
FIGS. 2A to 2D illustrate a method of manufacturing the light emitting device according to the first embodiment, each showing a schematic plan view and a sectional view taken along line A-A in the corresponding schematic plan view.

First, as illustrated in FIG. 2A, the base member 10 having the groove X is prepared. For example, the base member 10 includes a recess portion 11, and in this case, the groove X is formed in a bottom surface of the recess portion 11. The groove X can be formed in one or both of the insulating member and the conductive member of the base member 10. In addition, the base member 10 may include a depressed portion 13 for facilitating disposition of the light reflective member 30 in at least a part of the bottom surface of the recess portion 11.

The groove X may be connected to the surrounding region Y that surrounds the plurality of light emitting elements 21 and 22, for example. In this case, for example, a recess portion that is continuous from the surrounding region Y of the plurality of light emitting elements 21 and 22 to the light emitting element can be formed as the groove X. Alternatively, the groove X may be formed at a portion where the light emitting elements 21 and 22 are not mounted. The groove X may be either linear or curved.

(Second Step) Mounting Plurality of Light Emitting Elements on Base Member

Figure 2B:
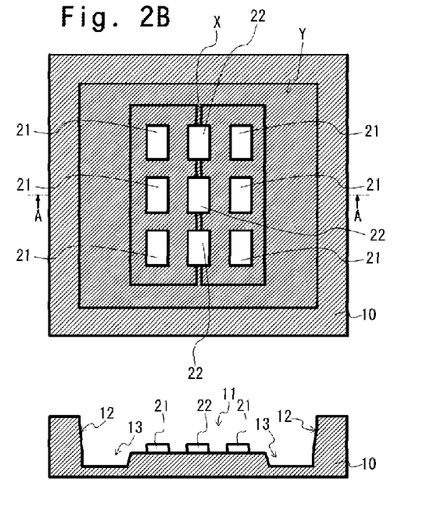

Next, as illustrated in FIG. 2B, the plurality of light emitting elements 21 and 22 are mounted on the base member 10 that is prepared as above.

Figure 2C:
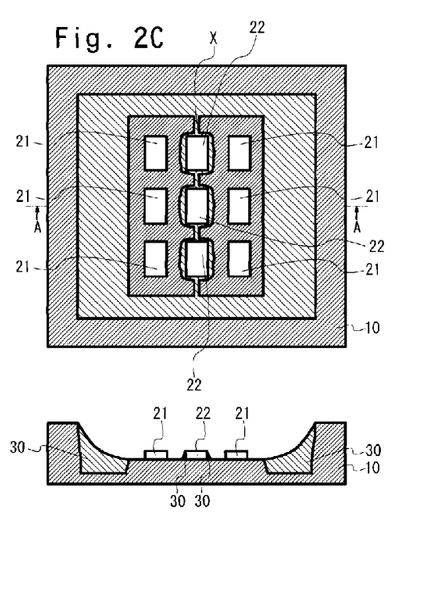

(Third Step) Disposing Light Reflective Member on Base Member and Leading Light Reflective Member to Cover Side Surface of at Least One of Plurality of Light Emitting Elements Then, as illustrated in FIG. 2C, the light reflective member 30 is disposed on the base member 10, and using the groove X, the light reflective member 30 is led to cover a side surface of at least one of the plurality of light emitting elements 21 and 22 (the light emitting element 22 in the first embodiment).

The mode to place the light reflective member 30 on the base member 10 is not particularly limited, but the light reflective member 30 can be placed by dropping, coating, or the like. The locations of the light reflective member 30 to be placed on the base member 10 are not particularly limited. But, the light reflective member 30 may be placed, for example, in a region adjacent to the recess portion 11 of the base member 10 so that the inner wall 12 of the recess portion 11 of the base member 10 is covered with the light reflective member 30. In the case where the light reflective member 30 is placed by dropping, the light reflective member 30 may be dropped in the depressed portion 13 provided on the bottom surface of the base member 10. In this case, the light reflective member 30 can be placed with good precision.

The one side and the other side of at least one of a part of the plurality of light emitting elements 21 and 22 (in the first embodiment, the light emitting element 22 whose side surface is covered with the light reflective member 30) are respectively adjacent to an end of the groove X.

In this case, for example, the light reflective member 30 is placed through the groove X to one side of part of the plurality of light emitting elements 21 and 22 (in the first embodiment, the light emitting elements 22 whose side surfaces are covered with the light reflective member 30), along the side surfaces of the plurality of light emitting elements 21 and 22 (in the first embodiment, the light emitting element 22 whose side surfaces are covered with the light reflective member 30) from the one side to the other side of the light emitting element, and through the groove X from the other side of the plurality of light emitting elements 21 and 22 (in the first embodiment, the light emitting elements 22 whose side surfaces are covered with the light reflective member 30). Here, the light reflective member 30 may be led to the one side of part of the plurality of light emitting elements 21 and 22 (in the first embodiment, the light emitting element 22 whose side surface is covered with the light reflective member 30) from the surrounding region Y that surrounds the plurality of light emitting elements 21 and 22 through the groove X. The region adjacent to the inner wall 12 of the recess portion 11 of the base member 10 is one example of the surrounding region Y that surrounds the plurality of light emitting elements 21 and 22.

Further, in the case where the one side and the other side of the a part of the plurality of light emitting elements 21 and 22 (in the first embodiment, the light emitting element 22 whose side surface is covered with the light reflective member 30) are respectively adjacent to an end of the groove X, and when the groove X is connected to the surrounding region Y that surrounds the plurality of light emitting elements 21 and 22, the light reflective member 30 may be led to the one side and the other side of the at least one of the plurality of light emitting elements 21 and 22 (in the first embodiment, the light emitting element 22 whose side surfaces are covered with the light reflective member 30) from the surrounding region Y that surrounds the plurality of light emitting elements 21 and 22 through the groove X.

The light reflective member 30 that is led to a part of the plurality of light emitting elements 21 and 22 (in the first embodiment, the light emitting element 22 whose side surface is covered with the light reflective member 30) from the surrounding region Y that surrounds the plurality of light emitting elements 21 and 22 through the groove X proceeds along the side surfaces of the plurality of light emitting elements 21 and 22 (in the first embodiment, the light emitting element 22 whose side surface is covered with the light reflective member 30) due to surface tension, for example. Therefore, the light reflective member 30 can cover all or one or several side surfaces of the plurality of light emitting elements 21 and 22 (in the first embodiment, the light emitting element 22 whose side surface is covered with the light reflective member 30).

Here, the at least one of the part of the plurality of light emitting elements 21 and 22 (in the first embodiment, the light emitting element 22 whose side surface is covered with the light reflective member 30) may be arranged so that the side surface covered with the light reflective member 30 faces a side surface of the light emitting element 21 that is not covered with the light reflective member 30. Further, at least one of the part of the plurality of light emitting elements 21 and 22 (in the first embodiment, the light emitting element 22 whose side surface is covered with the light reflective member 30) may be disposed between the light emitting elements 21 whose side surface is not covered with the light reflective member 30. According to the first embodiment, it is possible to manufacture a light emitting device capable of effectively reducing absorption of light which is emitted from a light emitting element and absorbed by other light emitting elements, even in a configuration in which a part of light emitted from such a light emitting element may be easily incident on and absorbed by a light emitting element.

(Fourth Step) Sealing Plurality of Light Emitting Elements with Sealing Member

Figure 2D:
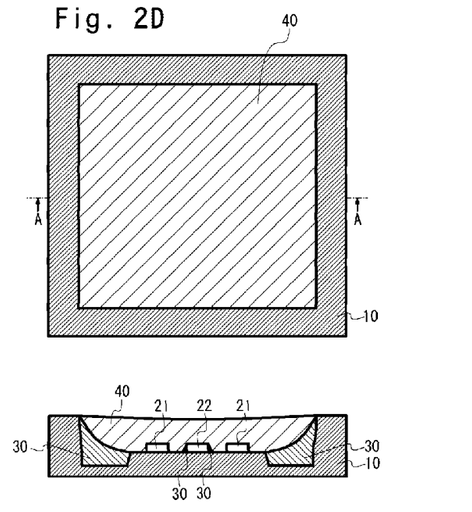

Next, as illustrated in FIG. 2D, the plurality of light emitting elements 21 and 22 are sealed by the sealing member 40.

In the method of manufacturing the light emitting device according to the first embodiment described above, the light reflective member 30 can be led to the light emitting element 22 using the groove X provided in the base member 10. Therefore, it is possible to manufacture the light emitting device according to the first embodiment at favorable yield and low cost without increasing manufacturing steps.

In the first embodiment, the configuration in which all or one or several side surfaces of the light emitting element 22 is covered with the light reflective member 30 after the plurality of light emitting elements 21 and 22 are mounted. However, the present invention is not limited to such a configuration. According to the present invention, the light emitting element 22 having all or one or several side surfaces already covered with the light reflective member 30 may be mounted on the base member 10, for example.

Light Emitting Device According to Second Embodiment

Figure 3A:
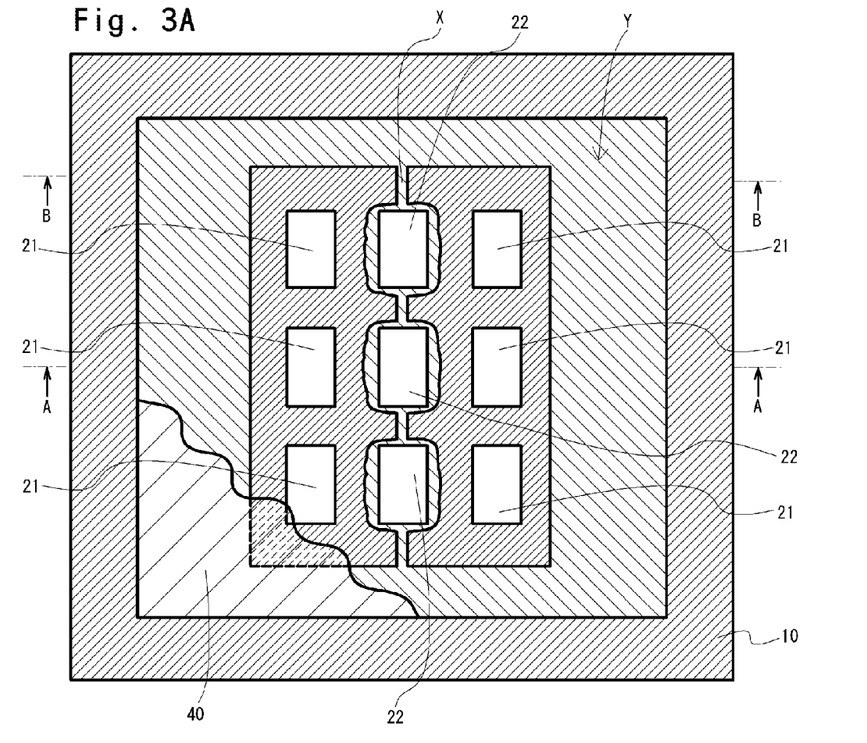
FIG. 3A shows a plan view.
Figure 3B:
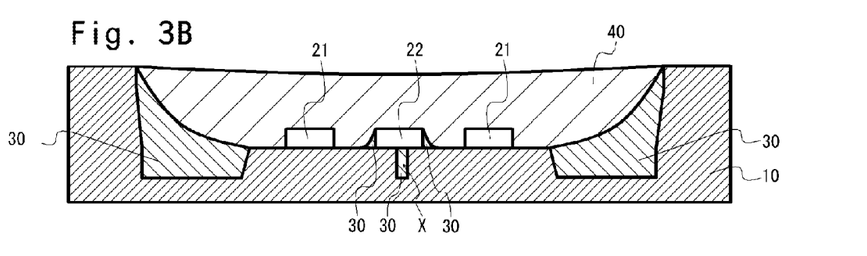
FIG. 3B shows a sectional view taken along line A-A in FIG. 3A.
Figure 3C:
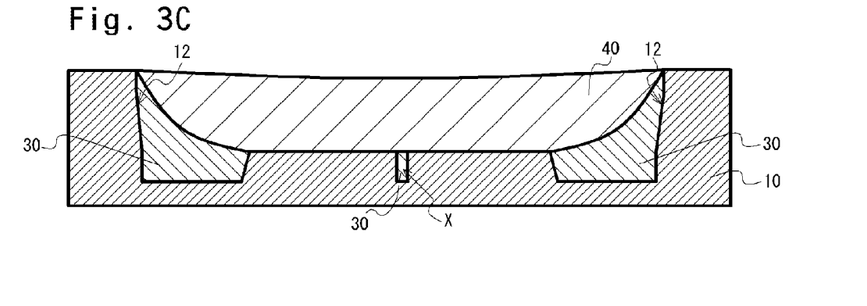
FIG. 3C shows a sectional view taken along line B-B in FIG. 3A.
Figure 4A:
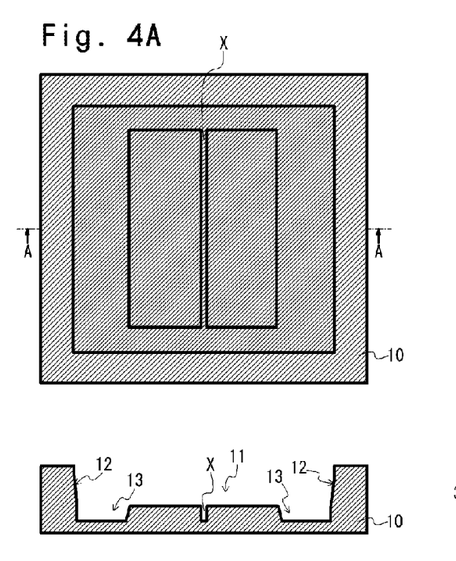
FIGS. 4A to 4D illustrate a method of manufacturing the light emitting device according to the second embodiment, each showing a schematic plan view and a sectional view taken along line A-A in the corresponding schematic plan view.
Figure 4B:
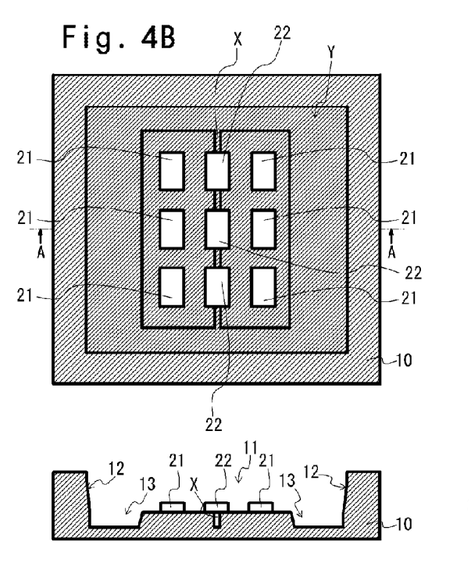
Figure 4C:
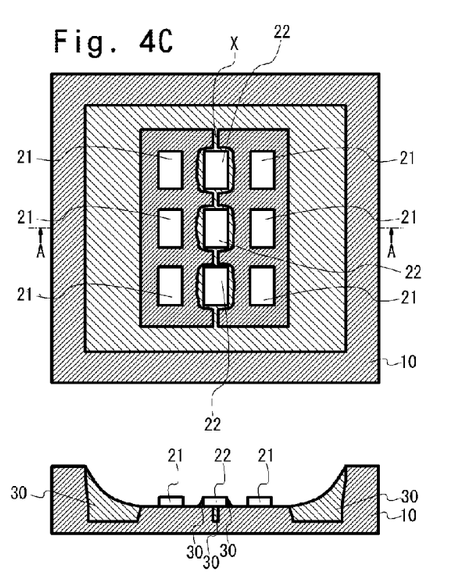
Figure 4D:
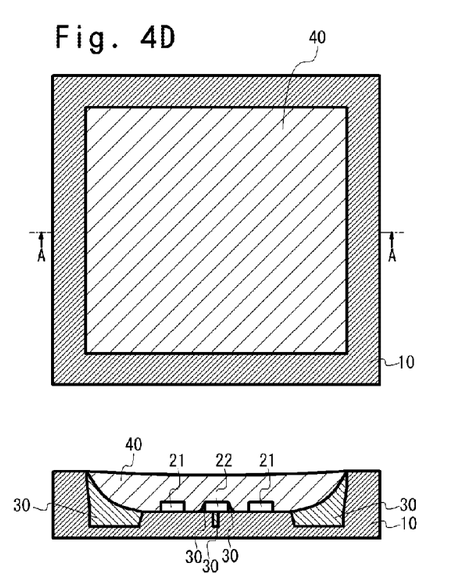

FIGS. 3A to 3C schematically illustrate a light emitting device according to a second embodiment, where FIG. 3A shows a plan view, FIG. 3B shows a sectional view taken along line A-A in FIG. 3A, and FIG. 3C shows a sectional view taken along line B-B in FIG. 3A. FIGS. 4A to 4D illustrate a method of manufacturing the light emitting device according to the second embodiment, each showing a schematic plan view and a sectional view taken along line A-A in the corresponding schematic plan view.

As illustrated in FIGS. 3A to 3C and FIGS. 4A to 4D, the light emitting device according to the second embodiment and the method of manufacturing this light emitting device include one groove X that leads the light reflective member 30 to the second light emitting element 22 is provided linearly, and that the second light emitting element 22 is disposed across the groove X, while the light emitting device according to the first embodiment and the method of manufacturing this light emitting device include a plurality of groove X. With the light emitting device according to the second embodiment, similarly to the light emitting device according to the first embodiment, it is possible to improve a light-extraction efficiency of the light emitting device as a whole. Further, with the method of manufacturing the light emitting device according to the second embodiment, similarly to the method of manufacturing the light emitting device according to the first embodiment, it is possible to manufacture the light emitting device according to the second embodiment at favorable yield and low cost without increasing manufacturing steps.

While the embodiments have been described, these descriptions relate to exemplary and representative examples of the present invention, and do not limit the present invention in any way. The invention is not limited to these embodiments. Further, various modifications can be adopted therein without departing from the scope of the invention.

REFERENCE NUMBERS IN THE FIGURES

10: Base Member
11: Recess Portion
12: Inner Wall of Recess Portion
13: Depressed Portion
21: First Light emitting Element
22: Second Light emitting Element
30: Light Reflective Member
40: Sealing Member
X: Groove
Y: Surrounding Region

What is claimed is:

1. A light emitting device comprising:
a base member; and
a plurality of light emitting elements mounted on the base member,
wherein the plurality of light emitting elements includes:
at least one first light emitting element having a lateral surface uncovered by a light reflective member, and
at least one second light emitting element having a lateral surface covered by the light reflective member, and
wherein the base member includes at least one groove configured to lead the light reflective member to the at least one second light emitting element.

2. The light emitting device according to claim 1, wherein the lateral surface of the at least one second light emitting element covered with the light reflective member faces the lateral surface of the at least one first light emitting element.

3. The light emitting device according to claim 2, wherein the at least one second light emitting element is disposed between at least two of the first light emitting elements.

4. The light emitting device according to claim 1, wherein:
the base member includes a recess portion, and
the recess portion has an inner wall covered with the light reflective member.

5. The light emitting device according to claim 2, wherein:
the base member includes a recess portion, and
the recess portion has an inner wall covered with the light reflective member.

6. The light emitting device according to claim 1, wherein the at least one second light emitting element is disposed across the at least one groove.

7. The light emitting device according to claim 3, wherein the at least one second light emitting element is disposed across the at least one groove.

8. The light emitting device according to claim 1, wherein the light reflective member is provided in a surrounding region that surrounds the plurality of light emitting elements and in a groove connected to a first side of the at least one second light emitting element, along the side surface of the at least one second light emitting element from the first side to a second side of the at least one second light emitting element, and in a groove from the second side of the at least one second light emitting element.

9. The light emitting device according to claim 2, wherein the light reflective member is provided in a surrounding region that surrounds the plurality of light emitting elements and in a groove connected to a first side of the at least one second light emitting element, along the side surface of the at least one second light emitting element from the first side to a second side of the at least one second light emitting element, and in a groove from the second side of the at least one second light emitting element.

10. A method of manufacturing a light emitting device, the method comprising:
providing a base member having at least one groove;
mounting a plurality of light emitting elements on the base member, the plurality of light emitting elements including at least one first light emitting element and at least one second light emitting element; and
disposing a light reflective member on the base member and leading the light reflective member via at least one groove such that the light reflective member does not cover a lateral surface of the at least one first light emitting element and the light reflective member covers a lateral surface of the at least one second light emitting element.

11. The method of manufacturing a light emitting device according to claim 10, wherein the lateral surface covered with the light reflective member of the at least one second light emitting element faces the lateral surface of one of the at least one first light emitting element.

12. The method of manufacturing a light emitting device according to claim 11, wherein the at least one second light emitting element is disposed between two of the first light emitting elements.

13. The method of manufacturing a light emitting device according to claim 10, wherein a first side and a second side of the at least one second light emitting element are respectively adjacent to an end of the at least one grooves.

14. The method of manufacturing a light emitting device according to claim 11, wherein a first side and a second side of the at least one second light emitting element are respectively adjacent to an end of the at least one grooves.

15. The method of manufacturing a light emitting device according to claim 10, wherein the at least one groove is connected to a surrounding region that surrounds the plurality of light emitting elements.

16. The method of manufacturing a light emitting device according to claim 11, wherein the at least one groove is connected to a surrounding region that surrounds the plurality of light emitting elements.

17. The method of manufacturing a light emitting device according to claim 10, wherein the base member includes a recess portion.

18. The method of manufacturing a light emitting device according to claim 17, wherein the recess portion of the base member has an inner wall covered with the light reflective member.

19. The method of manufacturing a light emitting device according to claim 10, wherein the light reflective member is provided in a surrounding region that surrounds the plurality of light emitting elements and in the at least one groove connected to a first side of the at least one second light emitting element, along the side surface of the at least one second light emitting element from the first side to a second side of the at least one second light emitting element, and in the at least one groove from the second side of the at least one second light emitting element.

20. The method of manufacturing a light emitting device according to claim 12, wherein the light reflective member is provided in a surrounding region that surrounds the plurality of light emitting elements and in the at least one groove connected to a first side of the at least one second light emitting element, along the side surface of the at least one second light emitting element from the first side to a second side of the at least one second light emitting element, and in the at least one groove from the second side of the at least one second light emitting element.

21. The method of manufacturing a light emitting device according to claim 10, wherein the at least one second light emitting element is disposed across the groove.

22. The method of manufacturing a light emitting device according to claim 12, wherein the at least one second light emitting element is disposed across the at least one groove.

* * * * *